United States Patent
Lee

(10) Patent No.: US 7,060,561 B2
(45) Date of Patent: Jun. 13, 2006

(54) METHOD FOR FABRICATING MEMORY DEVICE

(75) Inventor: Cheang Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/788,194

(22) Filed: Feb. 25, 2004

(65) Prior Publication Data

US 2005/0186735 A1 Aug. 25, 2005

(51) Int. Cl.
*H01L 21/336* (2006.01)

(52) U.S. Cl. ..................................... 438/257

(58) Field of Classification Search ........ 438/257–267, 438/FOR. 203; 257/314–320, E29.129, 257/E21.179, E21.422, E21.68, E21.681, 257/E21.683, E21.686, E21.687
See application file for complete search history.

(56) References Cited

U.S. PATENT DOCUMENTS

| | | | | |
|---|---|---|---|---|
| 6,342,715 B1 * | 1/2002 | Shimizu et al. | ............. | 257/314 |
| 6,667,507 B1 * | 12/2003 | Shirota et al. | ............... | 257/315 |
| 2003/0197234 A1 * | 10/2003 | Farrar | ........................ | 257/424 |

* cited by examiner

*Primary Examiner*—Brooke Kebede
(74) *Attorney, Agent, or Firm*—J.C. Patents

(57) ABSTRACT

The present invention relates to a method for fabricating a memory device. According to this invention, because the trenches for the isolation structures are etched simultaneously as patterning the first conductive layer and the first dielectric layer, the formed isolation structures are self-aligned with the stacked gate structures, thus increasing the reliability for the memory device by avoiding misalignment problems.

13 Claims, 14 Drawing Sheets

METHOD FOR FABRICATING MEMORY DEVICE

BACKGROUND OF THE INVENTION

1. Field of Invention

The present invention relates to a semiconductor device and the fabrication method thereof. More particularly, the present invention relates to a method for fabricating a memory device.

2. Description of Related Art

As the flash memories become more developed, they are customarily used in embedded application and sometimes in place of EPROM and EEPROM. The flash memory device allows multiple and repetitive writing, reading and erasure operations, and the storage data are retained even after the power supply is discontinued. Because of the aforementioned advantages, the flash memory has become the mainstream non-volatile memory device, which is widely applied in the electronic products, such as, personal computers, digital cameras and personal digital assistants (PDAs) etc.

At present, the commonly adopted flash memories can be classified as single gate flash memories, split gate flash memories and double gate flash memories. In general, the split gate flash memory cell (1.5T cell) is composed of a stacked gate consisting of a floating gate and a control gate, a select gate disposed on one side of the stacked gate and a source/drain region, while the double gate flash memory cell (2T cell) is composed of one stacked gate consisting of a floating gate and a control gate, source/drain regions and a select transistor disposed by one side of the stacked gate.

FIG. 1 is a top view illustrating a prior art memory structure. Referring to FIG. 1, a plurality of isolation structures 102 are disposed in the substrate 100. The isolation structures 102 define the active regions 104 in the substrate 100. The control gate line 114b, the floating gate (not shown), select gate line 115b and the source/drain region 116 constitute the first memory cell row 150, while control gate line 114a, the floating gate (not shown), select gate line 115a and the source/drain region 116 constitute the second memory cell row 160. Theoretically, the isolation structures 102 are formed as rectangle blocks in the design of the above flash memory structure. However, due to many uncontrollable factors of photolithography, corner rounding often occurs to the rectangle isolation structures 102 during the photolithography process. In order to solve the corner rounding problems, both ends of the isolation structure 102 are enlarged by the optical proximity correction technology. Therefore, the isolation structures 102 are customarily designed as a dumb-bell shape with both terminal blocks 102a enlarged. Because the enlarged ends of the isolation structures 102 occupy more areas in the active region 104 of the substrate 100, the prior art flash memory structure usually occupies more chip areas and hinders high integration of the device.

FIG. 2 is a cross-sectional view of the memory structure of FIG. 1. Referring to both FIGS. 1 and 2, after depositing the first polysilicon layer 108 for the floating gate, the first polysilicon layer is patterned to remove a portion of the first polysilicon layer above both the enlarged terminal blocks 102a of the isolation structures 102 and the locations predetermined for the control gate lines and, thus forming rectangle openings 103. From FIG. 2, the edges of the patterned first polysilicon layer 108 don not align with the edges of the isolation structures 102. Afterwards, the silicon oxide/silicon nitride/silicon oxide (ONO) layer 110 is formed covering the patterned first polysilicon layer 108 and the second polysilicon layer 112 is then deposited for forming the control gate lines and the select gate lines. However, the ONO layer and the polysilicon fence residue near the edge of the patterned first polysilicon layer 108 may result in horizontal two bits and cause reliability problems.

Moreover, once misalignment happens during defining the openings in the first polysilicon layer, the openings 103 may shift to undesirable positions, or even the predetermined location for the select gate line. In this case, the memory cells in different rows will have unequal electrical properties. In order to solve such problems, a predetermined distance is preserved between the corners of the expanded blocks of the isolation structures and the select gate line for keeping the select gate line away from the corners. Nonetheless, the distance between two adjacent memory cells is increased, leading to consuming more chip areas and preventing the device from having higher level of integration.

SUMMARY OF THE INVENTION

The invention provides a method for fabricating a memory device, of which the isolation structures occupy less active regions. The dimension of the memory cell can be shrunk and the memory device takes less chip areas.

The invention provides a method for fabricating a memory device, which avoids the problems of varying electrical properties for different memory cells and enhances the reliability for the memory device.

As embodied and broadly described herein, the fabrication method of the present invention provides a memory device disposed in the substrate. After forming a first dielectric layer and a first conductive layer over the substrate, the first conductive layer and the first dielectric layer are patterned to form a plurality of stacked gate lines and simultaneously a plurality of trenches are defined in the substrate in a self-aligned way. A plurality of strip isolation structures substantially parallel to one another is formed in the substrate by filling an insulating material into the trenches. A second dielectric layer is formed covering the stacked gate lines and the strip isolation structures. Following patterning the second dielectric layer, a plurality of select gate lines and a plurality of control gate lines are formed. Each select gate line is disposed on the first conductive layer, while each control gate line is disposed on the second dielectric layer. The select gate lines and the control gate lines are disposed in a direction substantially vertical to the strip isolation structures. In the subsequent process steps, a plurality of source/drain regions is formed in the substrate, and a third dielectric layer including a plurality of contacts is formed over the substrate.

In the present invention, because the trenches for the isolation structures are etched simultaneously as patterning the first conductive layer and the first dielectric layer, the formed isolation structures are self-aligned with the stacked gate structures, thus increasing the reliability for the memory device by avoiding misalignment problems.

Moreover, the isolation structures of this invention can be formed in strip shapes, the corner rounding problems therefore can be alleviated and prior problems of unequal electrical properties for different memory cells are avoided even if misalignment occurs. The present invention needs not to preserve greater distances between the corners of the isolation structures and the select gate lines for keeping the select gate lines away from the corners. Thus, distance between the memory cells is efficiently reduced and the areas of the memory cells are effectively decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 3A–3D are top views illustrating the process steps for forming a memory structure according to one preferred embodiment of the present invention. FIGS. 4A–4I are cross-sectional views illustrating the process steps for forming the memory structure of FIGS. 3A–3D along the line I–I', according to one preferred embodiment of the present invention. FIGS. 5A–5K are cross-sectional views illustrating the process steps for forming the memory structure of FIGS. 3A–3D along the line II–II', according to one preferred embodiment of the present invention.

Figure 1:
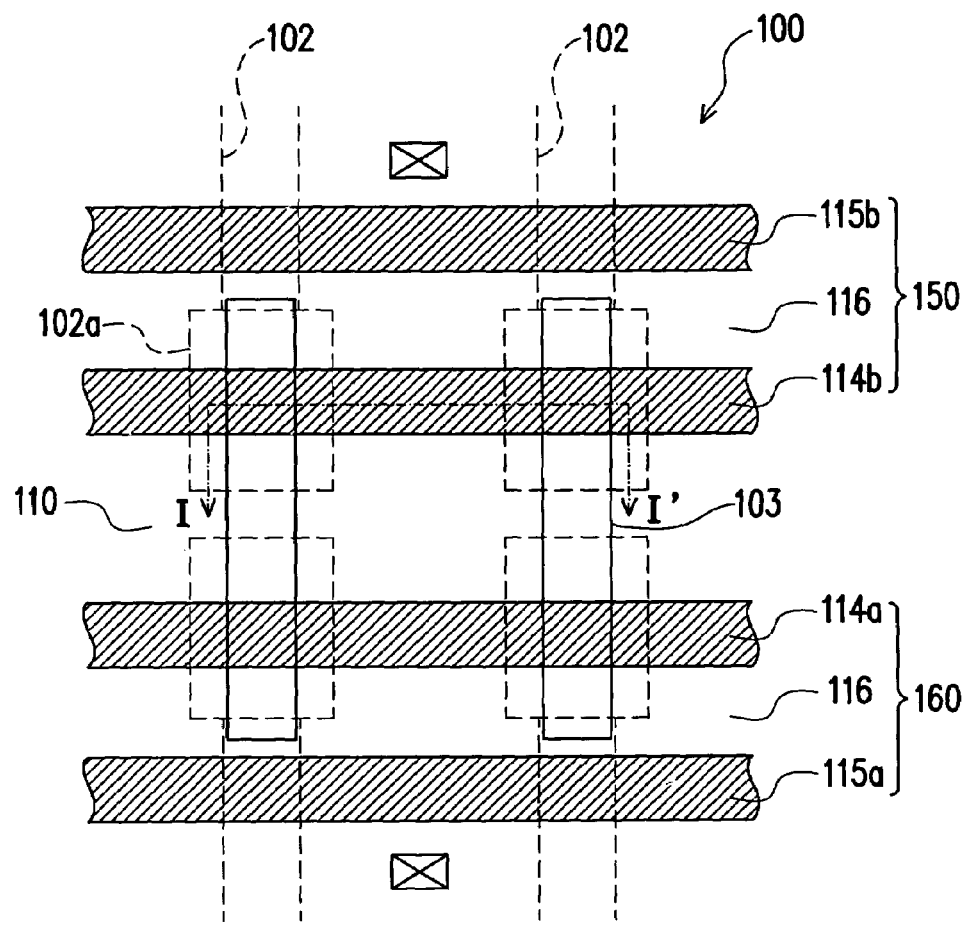
FIG. 1 is a top view illustrating a prior art memory structure.
Figure 2:
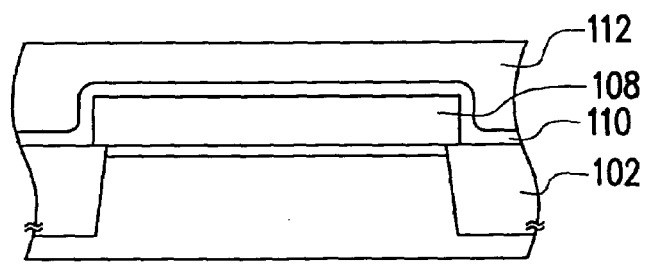
FIG. 2 is a cross-sectional view for the prior art memory structure of FIG. 1.
Figure 3A:
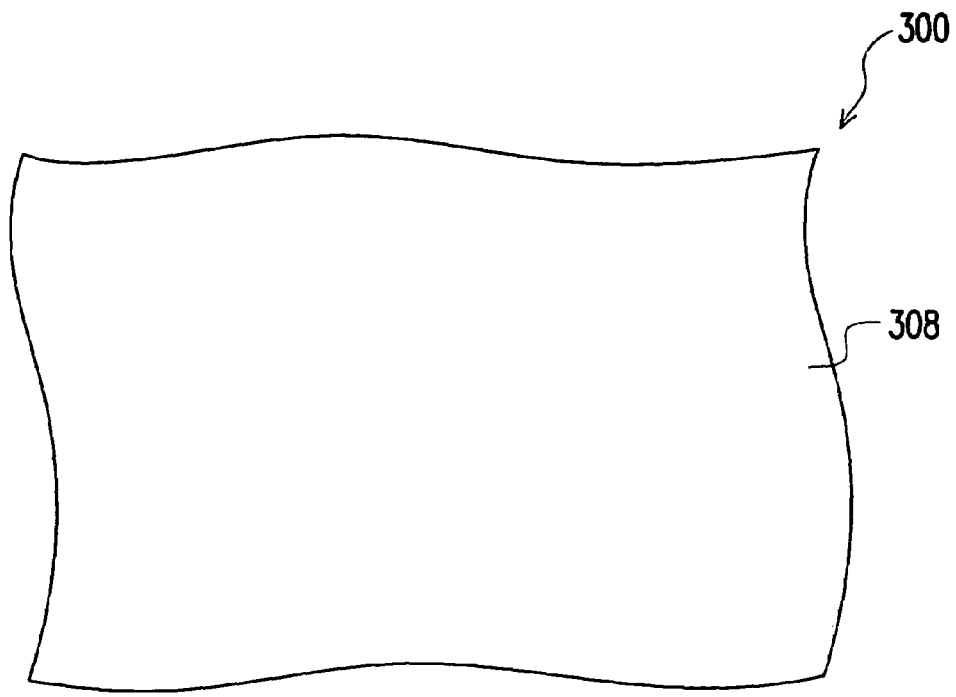
FIGS. 3A–3D are top views illustrating the process steps for forming a memory structure according to preferred embodiments of the present invention.
Figure 4A:
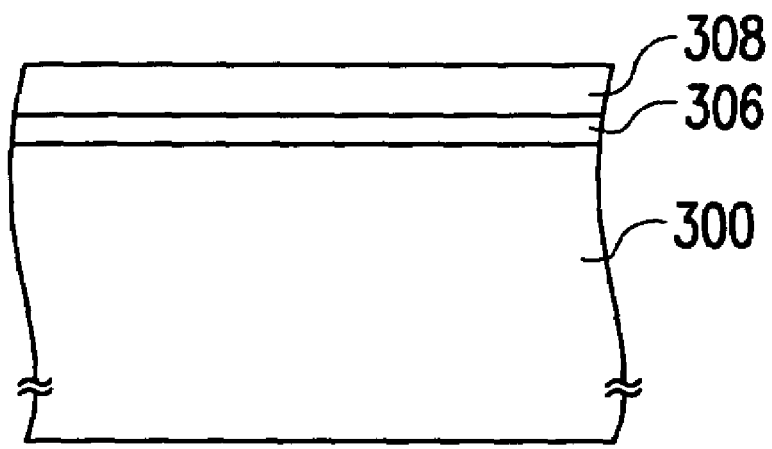
FIGS. 4A–4I are cross-sectional views illustrating the process steps for forming the memory structure of FIGS. 3A–3D along the line I–I', according to one preferred embodiment of the present invention.
Figure 5A:
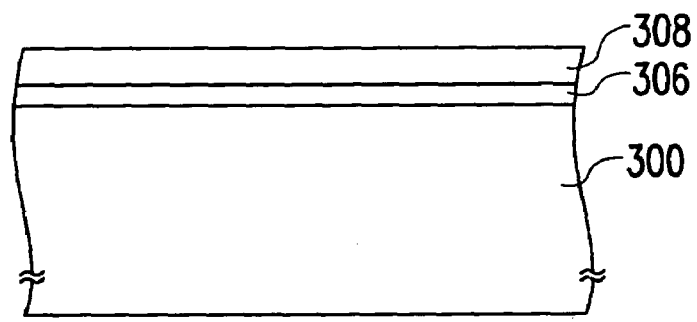
FIGS. 5A–5K are cross-sectional views illustrating the process steps for forming the memory structure of FIGS. 3A–3D along the line II–II', according to one preferred embodiment of the present invention.

Referring to FIGS. 3A, 4A and 5A, a first dielectric layer 306 is formed on the semiconductor substrate 300. The material of the first dielectric layer 306 can be silicon oxide formed by thermal oxidation, for example. A first conductive layer 308 is formed on the first dielectric layer 306 and over the substrate 300. The first conductive layer 308 can be formed by depositing a conductive material layer, for example, a polysilicon layer by chemical vapor deposition.

Figure 3B:
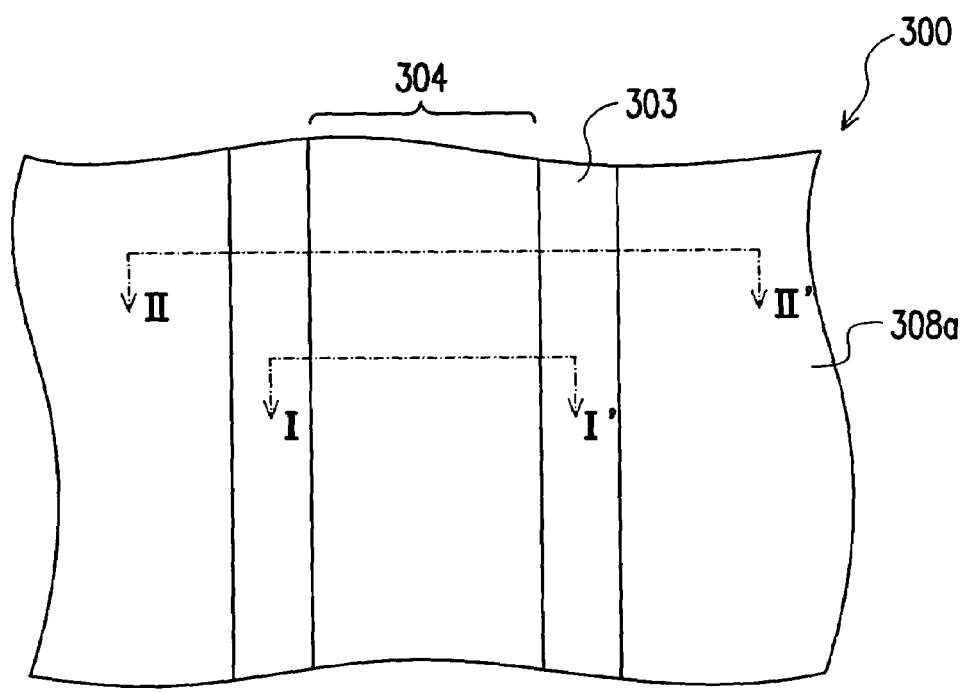
Figure 3C:
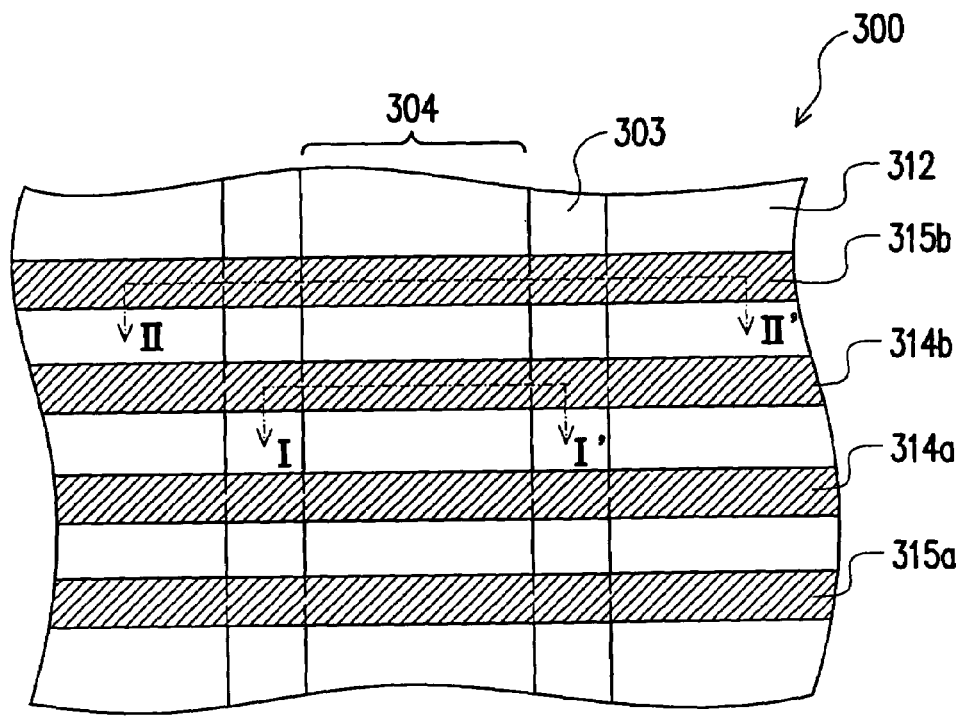
Figure 3D:
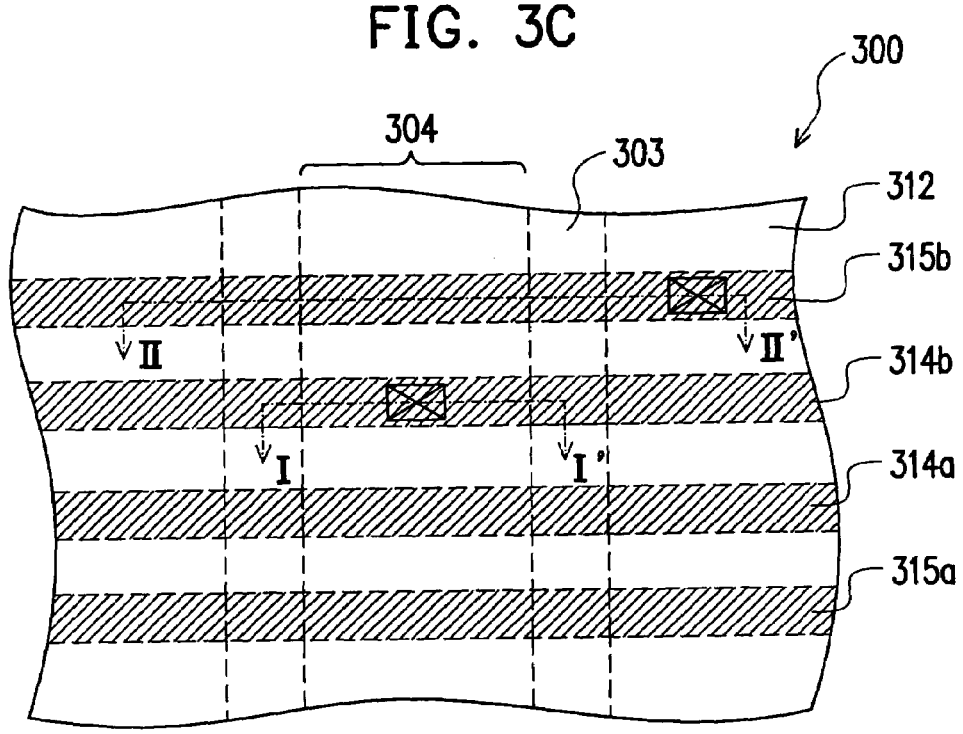
Figure 4B:
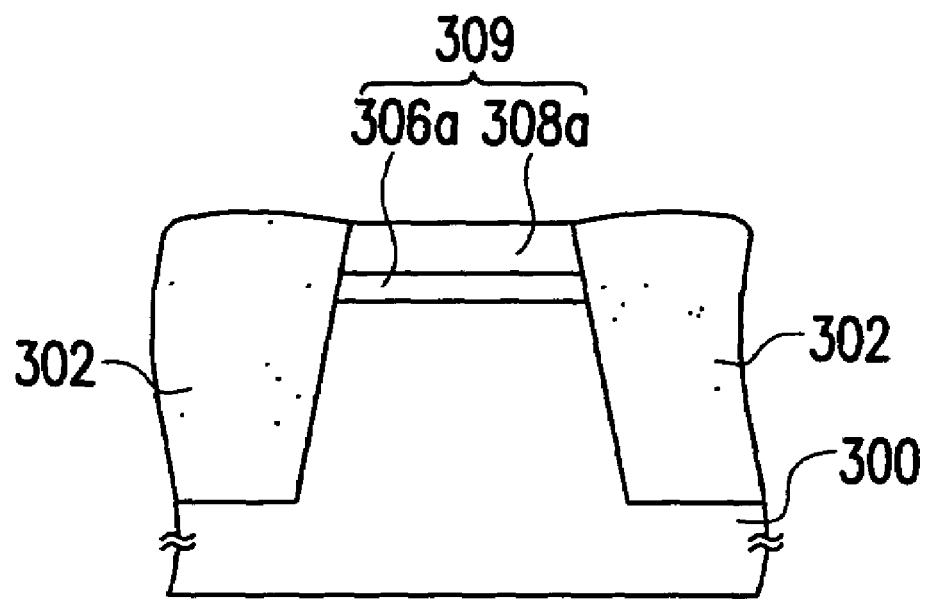
Figure 5B:
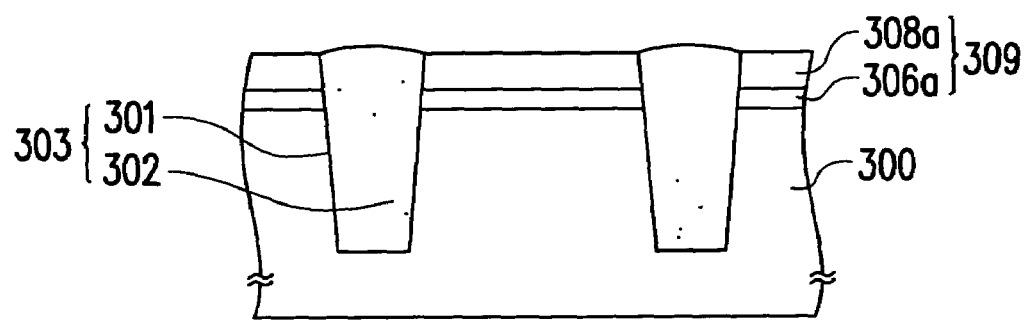

Referring to FIGS. 3B, 4B and 5B, using a photomask (not shown) with a pattern for defining trenches of the isolation structures, the first conductive layer 308 and the first dielectric layer 306 are then patterned by photolithography and etching, to form stacked gate structures consisting of conductive layers 308a and first dielectric layers 306a. At the same time, in the same process of photolithography and etching with the same photomask with the pattern, the substrate 300 is patterned to form a plurality of trenches 301 in the substrate 300. Therefore, the edges of patterned conductive layers 308a and the patterned first dielectric layers 306a are aligned with the edges of the trenches 301. That is, the stacked gate structures 309 (the patterned conductive layers 308a and the patterned first dielectric layers 306a) are formed in a self-aligned way with the trenches in the same process of photolithography and etching. Preferably, the patterned conductive layers 308a and the patterned first dielectric layers 306a are in strip shapes.

Figure 4C:
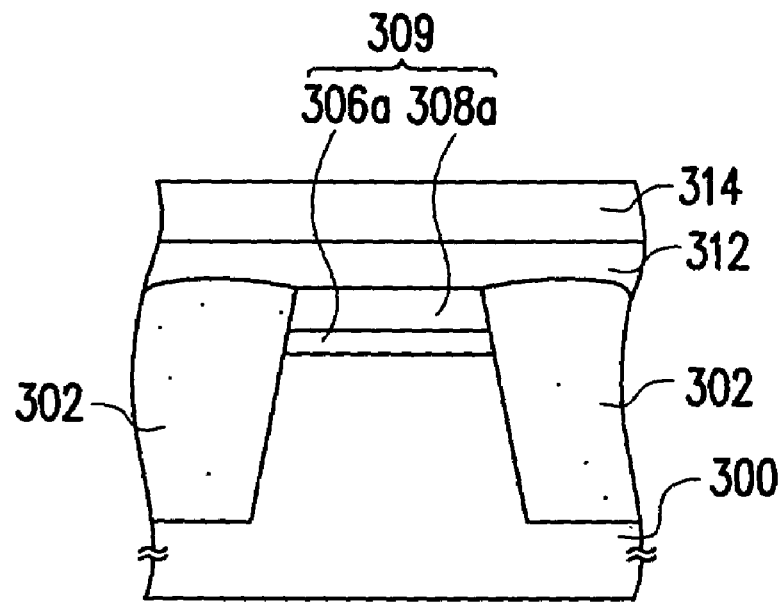
Figure 4D:
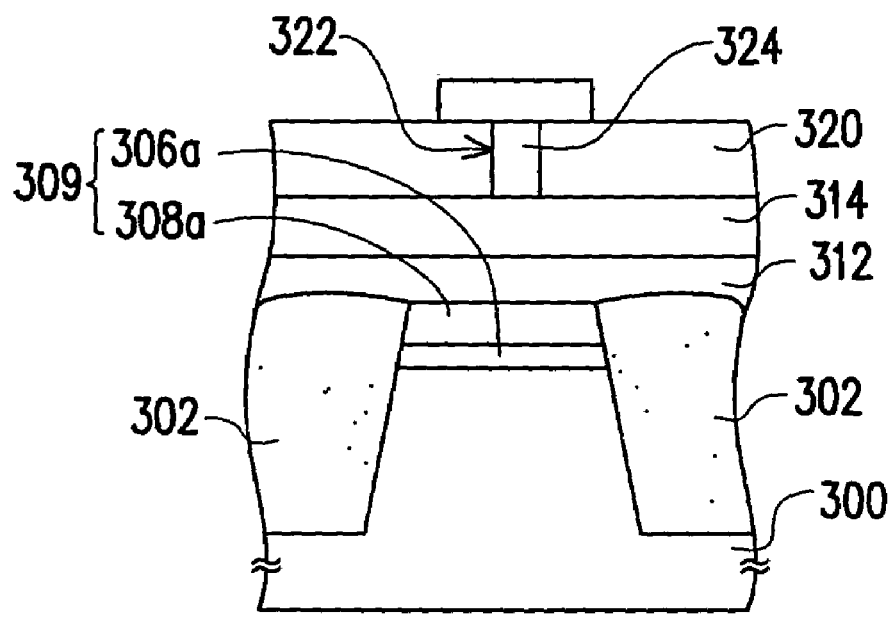
Figure 4E:
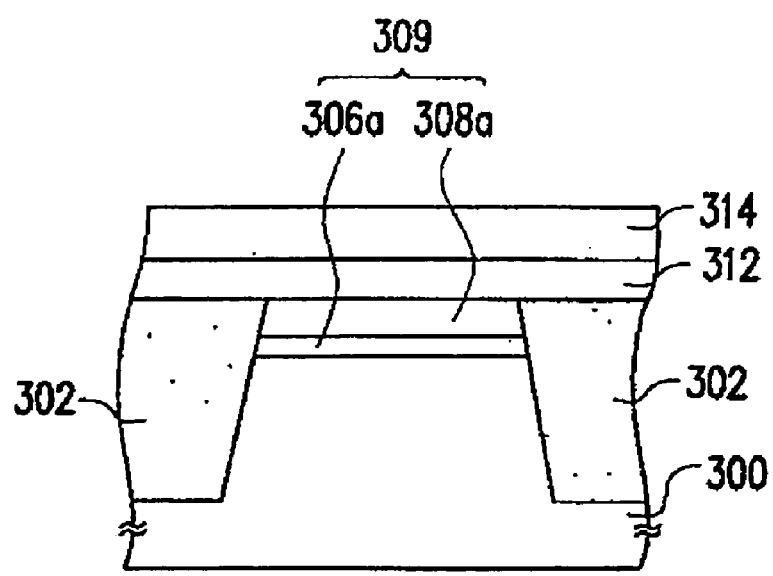
Figure 5C:
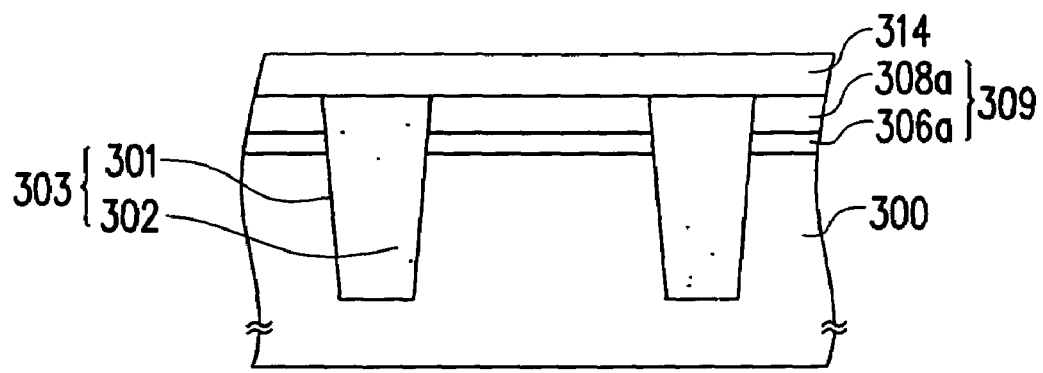
Figure 5D:
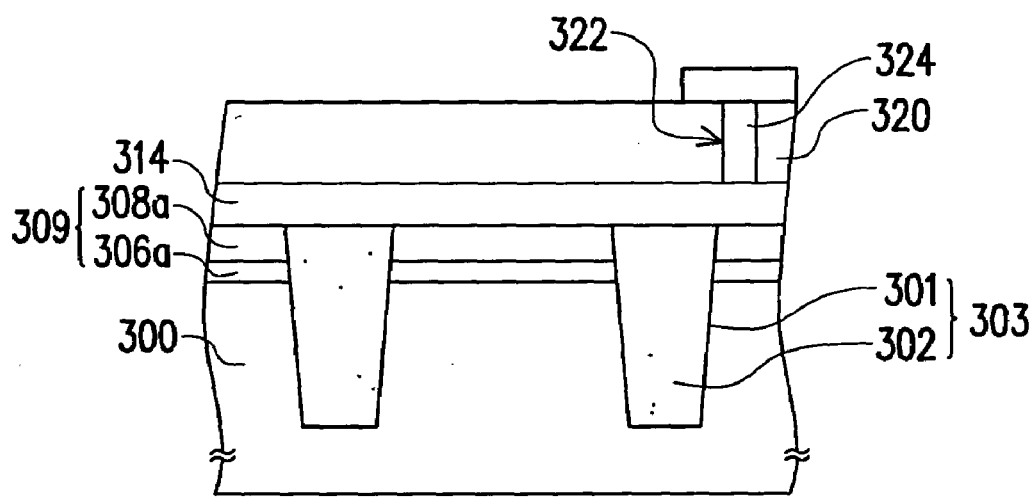
Figure 5E:
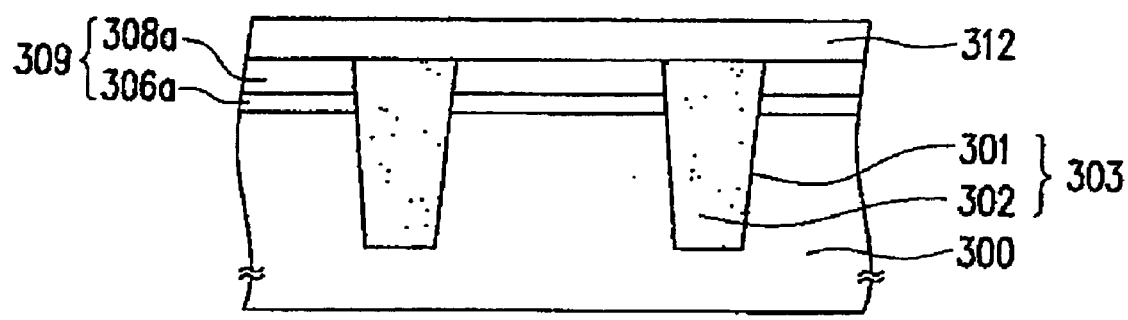
Figure 5F:
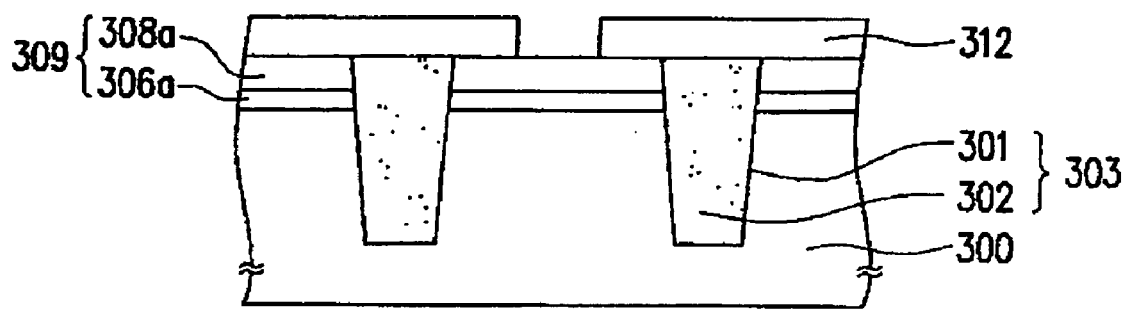
Figure 5G:
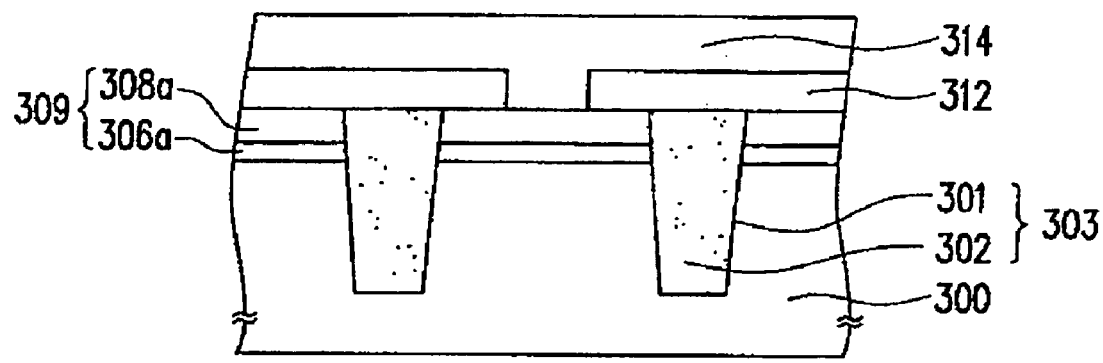

Next, referring to FIGS. 4C and 5C, an insulating material 302 is filled into the trenches 301, thus forming a plurality of isolation structures 303 is formed in the substrate 300 and defines a plurality of active regions 304 in the substrate 300. The isolation structures 303 can be, for example, shallow trench isolation structures (STI). The isolation structures 303 may be formed by forming an insulating material layer (not shown) over the substrate 300 to fill the trenches 301 and then performing chemical mechanical polishing or etching back to remove the insulating material layer until the first conductive layer 308 is exposed, for example, as shown in FIGS. 4D and 5D. Alternatively, a hard mask layer, such as a silicon oxide/silicon nitride layer, may be formed over the substrate 300 before patterning the first conductive layer 308 and the first dielectric layer 306 and forming the insulating material layer, so that the hard mask layer may act as a polishing stop layer or etching stop layer, for example. Preferably, the isolation structures 303 are in strip shapes and arranged substantially parallel to one another, so that the active regions 304 and the stacked gate structures 309 in strip shapes are defined. The active regions 304 are not connected to one another.

Referring to FIGS. 3C, 4E–4F and 5E–5F, a second dielectric layer 312 is formed over the substrate to cover the conductive layers 308a and the first dielectric layer 306a. The material of the second dielectric layer 312 can be silicon oxide, silicon oxide/silicon nitride, silicon oxide/silicon nitride/silicon oxide, or any dielectric materials having a dielectric constant higher than 8. For the predetermined regions for forming the select gate lines, the second dielectric layer 312 is removed by etching back. A second conductive layer 314 is formed over the substrate 300 covering the second dielectric layer 312. The second conductive layer 314 can be a composite layer of a polysilicon layer and a metal silicide layer formed by chemical vapor deposition, for example. Next, photolithography and etching are performed to pattern the second conductive layer 314, until the second dielectric layer 312 is exposed. The second conductive layer 314 is patterned into strip control gate lines 314a, 314b and strip select gate lines 315a, 315b, which are substantially parallel to one another. The select gate lines 314a, 314b are disposed between the control gate lines 315a, 315b. The second dielectric layer 312 in the regions for forming the select gate lines is removed before forming and patterning the second conductive layer 314, while the second dielectric layer 312 in the other regions is remained with the second conductive layer formed thereon. That is, the select gate lines 315a, 315b are disposed on the first conductive layer, while the control gate lines 314a, 314b are disposed on the second dielectric layer 312.

Figure 4F:
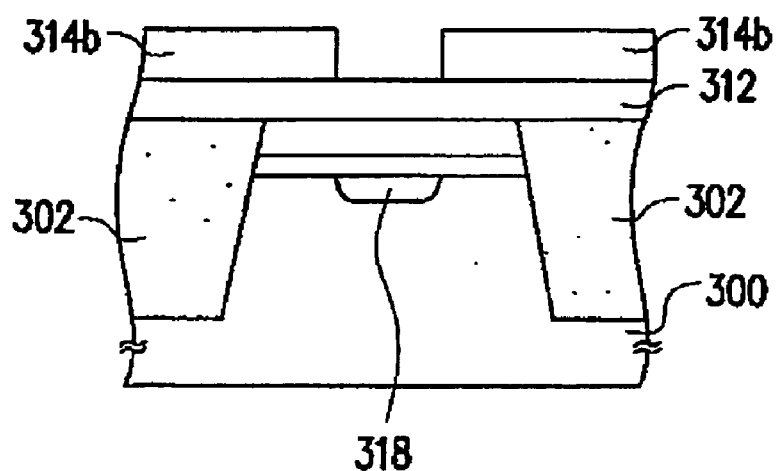
Figure 4G:
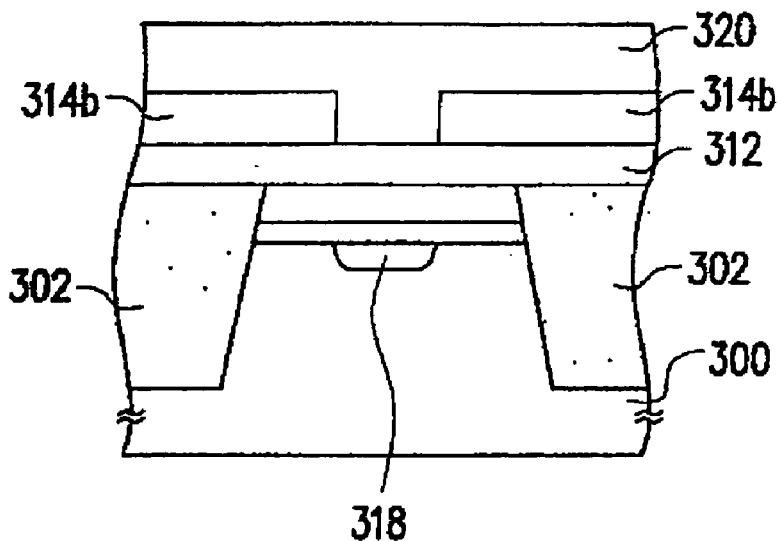
Figure 4H:
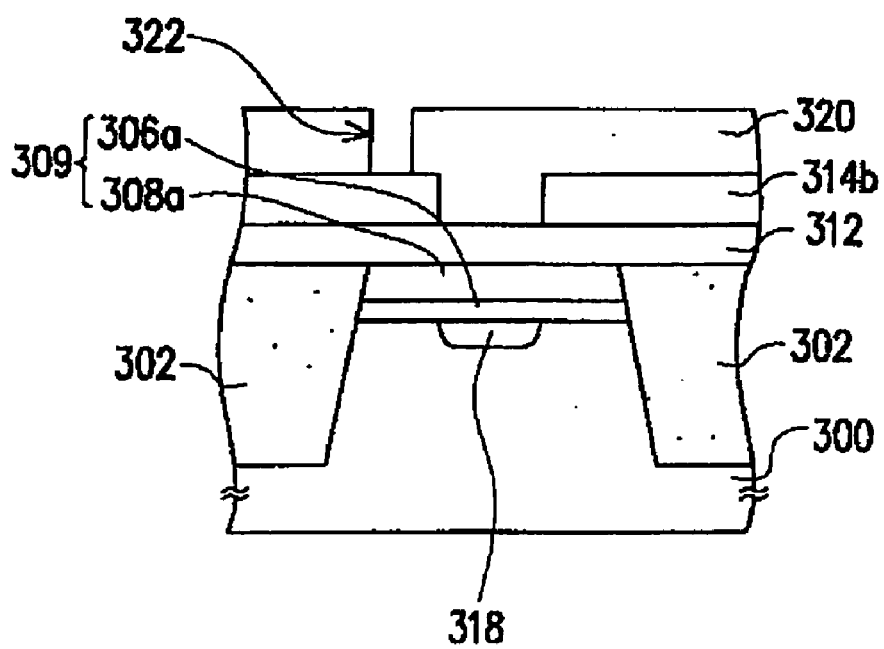
Figure 4I:
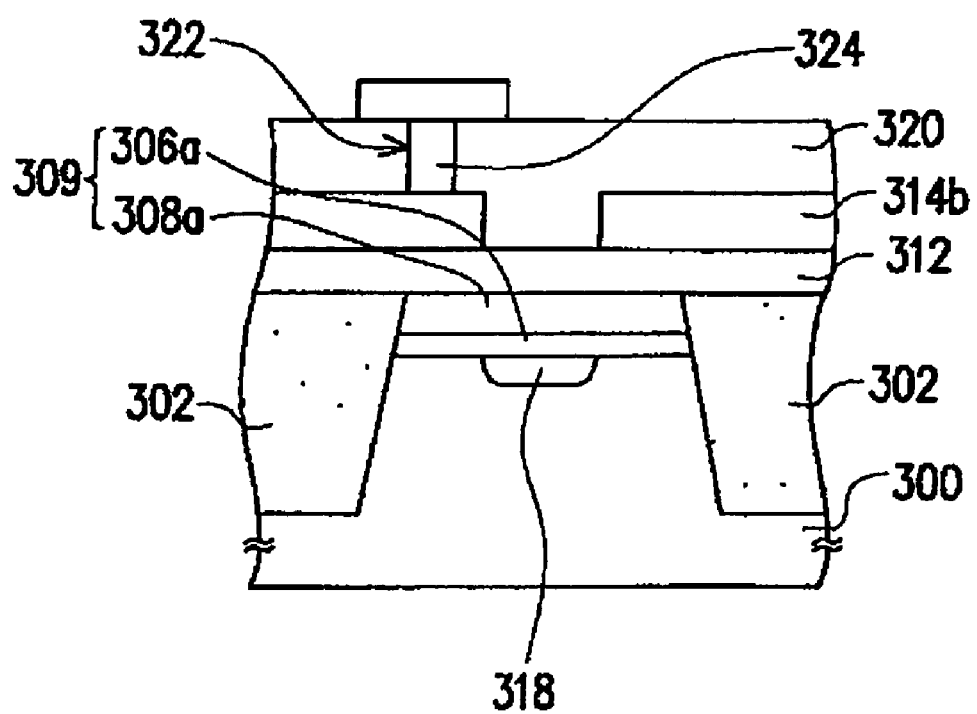
Figure 5H:
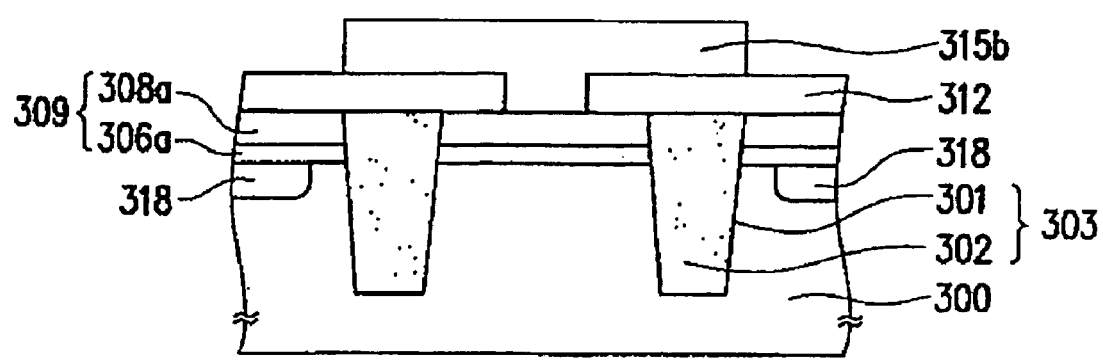
Figure 5I:
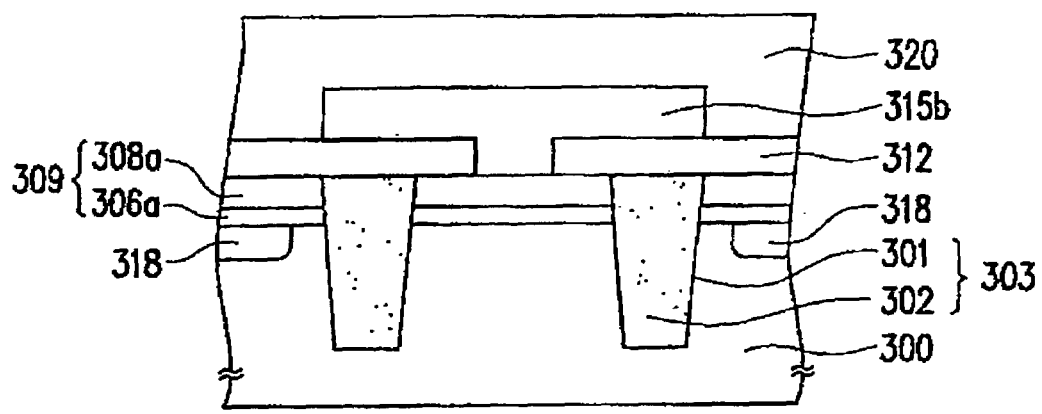
Figure 5J:
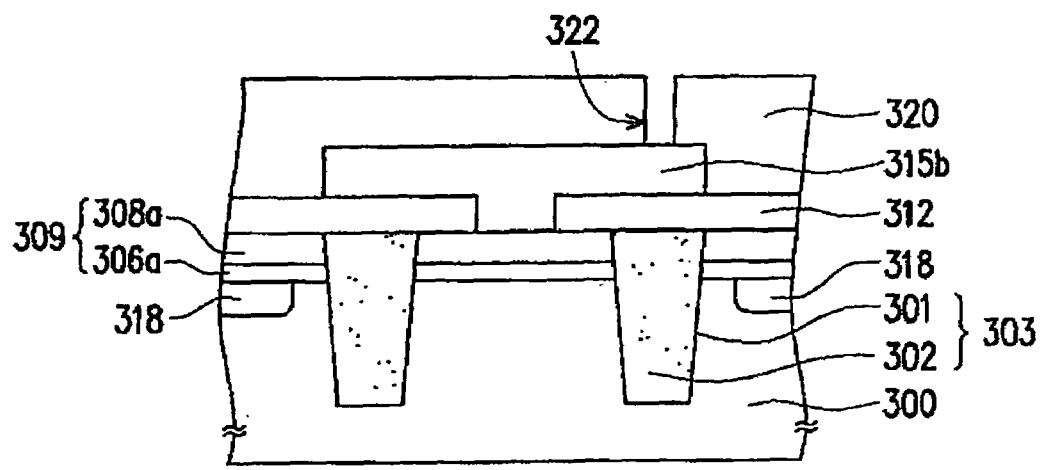
Figure 5K:
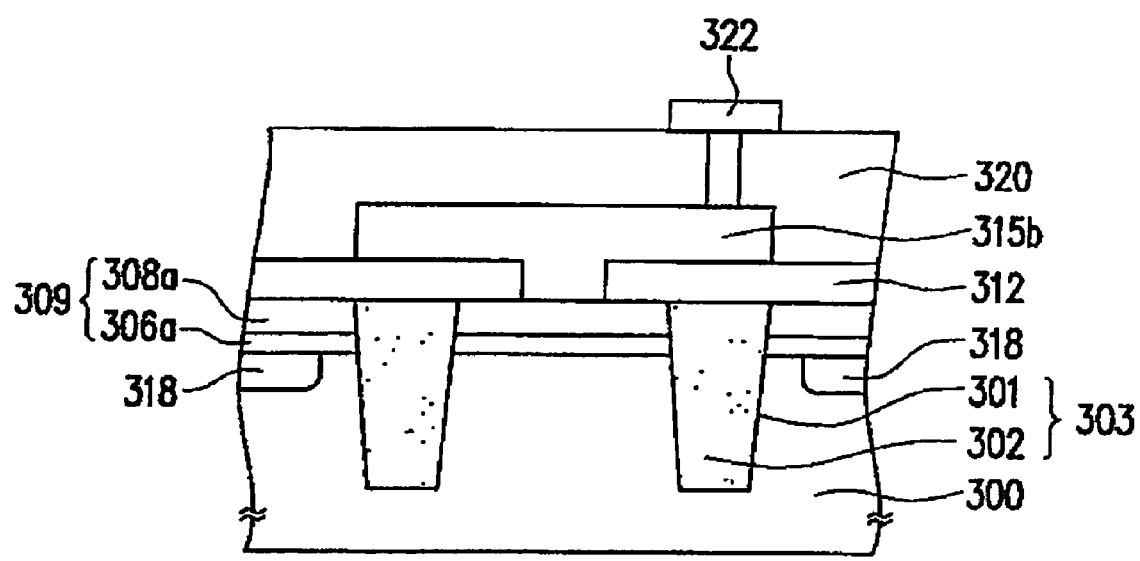

After forming a photoresist mask (not shown) over the substrate 300, an ion implantation process is performed to form source/drain regions 318 (as shown in FIGS. 4F and 5H) in the substrate 300 besides the select gate lines 315a, 315b and the control gate lines 314a, 314b.

Then, referring to FIGS. 3D, 4G–4I and 5I–5K, a thick dielectric layer 320 is formed over the substrate 300. The material of the thick dielectric layer 320 can be silicon oxide formed by chemical vapor deposition, for example. Next, a plurality of contact openings 322 is formed in the thick dielectric layer 320. The contact opening 322 exposes the second conductive layer 314 in the active regions 304. Next, a conductive material is filled into the contact openings 322 to form contacts 324. The contacts 324 can be formed by depositing the conductive material to fill up the contact openings 322 in the thick dielectric layer 320 and then performing chemical mechanical polishing (CMP) or etching back to remove extra conductive material above the dielectric layer 320, for example.

In the preferred embodiment of this invention, because the trenches for the isolation structures are etched simultaneously as patterning the first conductive layer and the first dielectric layer, the formed isolation structures are self-aligned with the stacked gate structures, thus increasing the reliability for the memory device by avoiding misalignment problems.

For the select gate lines of the aforementioned memory device, the second conductive layers are directly connected to (short to) the first conductive layer because the second dielectric layer under the select gate lines is removed. Therefore, in the select gate lines, the first and the second conductive layers can be considered as one conductive layer. Since the second conductive layer is short to the first conductive layer, it is unnecessary to remove the second conductive layer below the select gate lines. Therefore, the process steps are simplified.

Additionally, because the isolation structures of this invention are in strip shapes, the corner rounding problems can be alleviated and prior problems of unequal electrical properties for different memory cells are avoided even if misalignment occurs. The present invention needs not to preserve greater distances between the corners of the isolation structures and the select gate lines for keeping the select gate lines away from the corners. Moreover, the isolation structures need not to be enlarged at the ends. Thus, distance between the memory cells is efficiently reduced and the areas of the memory cells are effectively decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a memory device, comprising:
   providing a substrate;
   forming a first dielectric layer on the substrate;
   forming a first conductive layer on the first dielectric layer;
   patterning the first conductive layer and the first dielectric layer to form a plurality of stacked gate lines and simultaneously patterning a plurality of trenches in the substrate, in a same process of photolithography and etching;
   filling an insulating material into the trenches to form a plurality of strip isolation structures m the substrate, wherein the plurality of strip isolation structures are substantially parallel to one another;
   forming a second dielectric layer over the substrate covering the stacked gate lines and the strip isolation structures;
   patterning the second dielectric layer such that portions of second dielectric layer are removed to expose the first conductive layer at predetermined locations;
   forming a second conductive layer over patterned second dielectric layer;
   patterning the second conductive layer to form a plurality of select gate lines and a plurality of control gate lines, each said select gate line being disposed on the first conductive layer and each control gate line being disposed on the second dielectric layer, wherein the select gate lines and the control gate lines are disposed in a direction substantially vertical to the strip isolation structures;
   forming a plurality of source/drain regions in the substrate beside the select gate lines and the control gate lines;
   forming a third dielectric layer over the substrate covering the select gate lines and the control gate lines, wherein the third dielectric layer includes a plurality of contact openings in the third dielectric layer, exposing at least one of the select gate lines and at least one of the control gate lines; and
   filling a conductive material into the contact openings to form a plurality of contacts that connects to at least one of the select gate lines and at least one of the control gate lines.

2. The method of claim 1, wherein the step of filling an insulating material into the trenches to form a plurality of strip isolation structures in the substrate comprises:
   forming an insulating material layer over the substrate to fill the trenches; and
   performing a chemical mechanical polishing step to remove the insulating material layer above the first conductive layer.

3. The method of claim 2, further comprising forming a conformal mask layer on the first conductive layer before patterning the first conductive layer and the first dielectric layer and before forming the insulating material layer, wherein the mask layer act as a stop layer for the chemical mechanical polishing step.

4. The method of claim 1, wherein the step of forming a plurality of select gate lines and a plurality of control gate lines comprises:
   patterning the second conductive layer to form the plurality of select gate lines and the plurality of control gate lines; and
   wherein the plurality of contact openings in the third dielectric layer expose the patterned second conductive layer for at least one of the select gate lines and at least one of the control gate lines.

5. The method of claim 4, wherein a same material is used for forming the first and second conductive layers.

6. The method of claim 4, wherein the first conductive layer comprises a first polysilicon layer, while the second conductive layer comprises a second polysilicon layer.

7. The method of claim 1, wherein the second dielectric layer includes a silicon oxide/silicon nitride/silicon oxide layer.

8. A method for fabricating a memory device disposed in a substrate, comprising:
   forming an oxide layer on the substrate;
   forming a first conductive layer on the oxide layer;
   patterning the first conductive layer and the oxide layer to form a plurality of stacked gate lines and simultaneously etching the substrate to form a plurality of trenches in the substrate, in a self-aligned way;
   forming an insulating material layer to fill the trenches and then performing a planarizing step to form a plurality of strip isolation structures in the substrate, wherein the plurality of strip isolation structures are substantially parallel to one another;
   forming a dielectric layer over the substrate covering the stacked gate lines and the strip isolation structures;
   patterning the dielectric layer to expose a portion of the patterned first conductive layer;
   forming a second conductive layer over the substrate covering the dielectric layer and the exposed portion of the patterned first conductive layer;

patterning the second conductive layer to form a plurality of select gate lines and a plurality of control gate lines, each select gate line being disposed on the first conductive layer and each control gate line being disposed on the dielectric layer, wherein the select gate lines and the control gate lines are disposed substantially parallel to one another and disposed in a direction substantially vertical to the strip isolation structures;

forming a plurality of source/drain regions in the substrate beside the select gate lines and the control gate lines;

forming a thick dielectric layer over the substrate;

forming a plurality of contact openings in the thick dielectric layer, exposing at least one of the select gate lines and at least one of the control gate lines; and filling a conductive material into the contact openings to form a plurality of contacts that connects to at least one of the select gate lines and at least one of the control gate lines.

9. The method of claim 8, wherein the planarizing step is a chemical mechanical polishing step or an etching back step for removing the insulating material layer above the first conductive layer.

10. The method of claim 9, further comprising forming a conformal mask layer on the first conductive layer before patterning the first conductive layer and the oxide layer, wherein the mask layer act as a stop layer for the planarizing step.

11. The method of claim 8, wherein a same material is used to form the first and second conductive layers.

12. The method of claim 8, wherein the first conductive layer comprises a first polysilicon layer, while the second conductive layer comprises a second polysilicon layer.

13. The method of claim 8, wherein the dielectric layer includes a silicon oxide/silicon nitride/silicon oxide layer.

* * * * *